(12) United States Patent
Hasegawa et al.

(10) Patent No.: US 8,040,657 B2
(45) Date of Patent: Oct. 18, 2011

(54) CERAMIC MULTILAYER SUBSTRATE

(75) Inventors: Tomoyuki Hasegawa, Saku (JP);
Takashi Nagatomo, Saku (JP);
Yoshinori Ide, Minami-Saku Gun (JP);
Tadashi Otagiri, Nagoya (JP)

(73) Assignees: NGK Insulators, Ltd., Nagoya (JP);
Soshin Electric Co., Ltd., Saku-shi (JP)

( * ) Notice: Subject to any disclaimer, the term of this patent is extended or adjusted under 35 U.S.C. 154(b) by 0 days.

(21) Appl. No.: 12/714,706

(22) Filed: Mar. 1, 2010

(65) Prior Publication Data

US 2010/0149725 A1 Jun. 17, 2010

Related U.S. Application Data

(63) Continuation of application No. PCT/JP2008/064164, filed on Jul. 31, 2008.

(30) Foreign Application Priority Data

Sep. 28, 2007 (JP) ................................. 2007-253528

(51) Int. Cl.
*H01G 4/00* (2006.01)
*H05K 1/00* (2006.01)

(52) U.S. Cl. ............... 361/301.1; 361/321.1; 361/321.5; 174/258; 428/210

(58) Field of Classification Search .................. 428/210; 174/250–258; 361/301.1, 321.5
See application file for complete search history.

(56) References Cited

U.S. PATENT DOCUMENTS

| | | | |
|---|---|---|---|
| 4,222,885 A | 9/1980 | Hennings et al. | |
| 4,766,027 A * | 8/1988 | Burn | 428/210 |
| 5,041,342 A * | 8/1991 | Umeda et al. | 428/632 |
| 5,290,740 A | 3/1994 | Abe et al. | |
| 5,384,434 A * | 1/1995 | Mandai et al. | 174/258 |
| 5,757,611 A * | 5/1998 | Gurkovich et al. | 361/321.4 |
| 6,426,551 B1 * | 7/2002 | Kawakami et al. | 257/700 |
| 6,764,746 B2 * | 7/2004 | Oobuchi et al. | 428/209 |
| 6,797,093 B2 * | 9/2004 | Moriya et al. | 156/89.12 |
| 7,781,360 B2 * | 8/2010 | Hasegawa et al. | 501/138 |

FOREIGN PATENT DOCUMENTS

| | | |
|---|---|---|
| JP | 54-053300 A1 | 4/1979 |
| JP | 05-325641 A1 | 12/1993 |
| JP | 09-301768 A1 | 11/1997 |

(Continued)

OTHER PUBLICATIONS

Tomoyuki Hasegawa et al, "Dielectric Properties and Microstructures of Low-Temperature-Sintered BaTiO3-Based Ceramics with CuBi2O4 Sintering Aid," Japanese Journal of Applied Physics, vol. 45, No. 9B, 2006 pp. 7360-7364.

*Primary Examiner* — Cathy Lam
(74) *Attorney, Agent, or Firm* — Burr & Brown

(57) ABSTRACT

It is provided a ceramic multilayer substrate obtained by co-sintering a low dielectric constant layer made of an insulating material of a low dielectric constant and a high dielectric constant layer of a dielectric material of a high dielectric constant. The low dielectric constant layer includes a ceramic component of $xBaO\text{-}yTiO_2\text{-}zZnO$ ("x", "y" and "z" represent molar ratios, respectively, and satisfy the relationship: $x+y+z=1$; $0.09 \leq x \leq 0.20$; $0.49 \leq y \leq 0.61$; $0.19 \leq z \leq 0.42$) and 1.0 to 5.0 weight parts of a glass component comprising boron oxide with respect to 100 weight parts of the ceramic component. The high dielectric layer is made of a barium titanate based dielectric material with CuO and $Bi_2O_3$ added thereto.

5 Claims, 1 Drawing Sheet

FOREIGN PATENT DOCUMENTS

| | | | |
|---|---|---|---|
| JP | 2000-264722 A1 | 9/2000 |
| JP | 2000-264723 A1 | 9/2000 |
| JP | 2001-247365 A1 | 9/2001 |
| JP | 2001-313469 A1 | 11/2001 |
| JP | 2004-018325 A1 | 1/2004 |
| JP | 2004-203646 A1 | 7/2004 |
| JP | 2006-089352 A1 | 4/2006 |
| JP | 2006-093484 A1 | 4/2006 |
| JP | 2007-043162 A1 | 2/2007 |
| WO | 2007/122948 A1 | 11/2007 |

\* cited by examiner

CERAMIC MULTILAYER SUBSTRATE

FIELD OF THE INVENTION

The present invention relates to a ceramic multilayer substrate.

BACKGROUND OF THE INVENTION

In recent years, it is designed to attain miniaturization and density growth of electronic equipment, by integrating a passive part, such as a capacitor or inductor, conventionally mounted on a ceramic substrate surface into a ceramic multilayer substrate. Such a ceramic multilayer substrate is produced by forming a green sheet from a slurry of a dielectric porcelain composition and an organic solvent by doctor blade method followed by drying, printing a wiring conductor on the top surface of the sheet, forming a laminated body by laminating such green sheets of the same dielectric porcelain composition as described above, and co-firing it.

Such a ceramic multilayer substrate uses Ag or Cu with small specific resistance as the wiring conductor for performing high-performance signal processing at a high speed. Therefore, various ceramic materials have been developed for co-firing with Ag and Cu at temperatures lower than 962° C., the melting point of Ag, and 1084° C., the melting point of Cu.

In the above-mentioned ceramic multilayer substrate, a one having a dielectric constant of 10 or less is suitably used for suppressing stray capacitance or coupling capacitance between wires. While, when a capacitor is formed within the ceramic multilayer substrate, it is desirable for the ceramics constituting the capacitor to have a high dielectric constant.

The barium titanate-based dielectric porcelain composition generally has a high dielectric constant, and can form a high-capacity capacitor within the ceramic multilayer substrate. However, since it needs a sintering temperature as high as 1150 to 1200° C. or higher, Ag and Cu cannot be used as the wiring conductor to be co-fired. Therefore, it is necessary for the barium titanate-based dielectric porcelain composition to be sinterable at a temperature of 1000° C. or lower, while having practical dielectric constant and dielectric loss.

Various prior literatures are known for the barium titanate-based dielectric porcelain composition. Japanese Patent Publication No. S54-53300A describes addition of copper oxide and bismuth oxide into non-lead composition system.

Further, Japanese Patent Publication Nos. 2006-93484A and H05-325641A describe non-lead barium titanate based dielectric materials sinterable at a low temperature.

Further, according to "Japanese Journal of Applied Physics", Vol. 45, No. 9B, 2006, pp 7360 to 7364, "Dielectric properties and Microstructures of Low-temperature-Sintered BaTiO3-Based Ceramics with CuBiO4 sintering Aid", it is disclosed the addition of CuBi2O4 as a sintering aid to barium titanate dielectric material without the addition of a glass. It is thus confirmed that the barium titanate dielectric material can be sintered at 920° C. to provide good temperature dependence of specific dielectric constant. Specifically, it is disclosed that a specific dielectric constant of about 1900 and a dielectric loss of about 0.6 percent were obtained.

Further, many kinds of low dielectric ceramics were known in the field of ceramic multilayer substrate (Japanese Patent Publication Nos. H09-301768A, 2000-264722A and 2000-264723A).

SUMMARY OF THE INVENTION

For developing a novel and useful ceramic multilayer substrate, it is necessary to laminate and integrate a ceramic layer of a high dielectric constant, such as a condenser or capacitor, and a ceramic layer of a low dielectric constant. Further, according to the above reason, it is necessary that the ceramic layers of a high dielectric constant and a low dielectric constant can be sintered at a high density at a low temperature range of 1000° C. or lower. It is further necessary to bond the both layers without delamination and crack. In addition to this, diffusion of components tends to occur between the ceramic layers of high and low dielectric constants during the co-sintering, resulting in deterioration of the dielectric properties. It has not been known a ceramic multilayer substrate solving these problems.

The inventors disclosed a barium titanate based dielectric material of a high dielectric constant having a low dielectric loss and sinterable at a low temperature, in Japanese Patent Publication No. 2006-235529A. It is necessary, however, to strongly join the barium titanate based dielectric material with a ceramic layer of a low dielectric constant by co-sintering without delamination and cracks. Such technique has not been, however, provided yet.

An object of the invention is to join a barium titanate based dielectric material of a high dielectric constant and a low dielectric constant layer by co-sintering at a low temperature to provide a joined body, while preventing delamination and cracks.

The invention provides a ceramic multilayer substrate obtained by co-sintering layers of low and high dielectric constants. The layer of a low dielectric constant contains a ceramic component of a low dielectric constant of xBaO-yTiO$_2$-zZnO. "x", "y" and "z" represent molar ratios, respectively, and satisfy the relationships: x+y+z=1; $0.09 \leq x \leq 0.20$; $0.49 \leq y \leq 0.61$; $0.19 \leq z \leq 0.42$. The layer of a low dielectric constant further contains 1.0 to 5.0 weight parts of a glass component containing boron oxide with respect to 100 weight parts of the ceramic component. The layer of a high dielectric constant is made of a barium titanate based dielectric material with CuO and Bi$_2$O$_3$ added thereto.

According to the present invention, CuO and Bi$_2$O$_3$ are added to a barium titanate based dielectric material so that the optimum sintering temperature of the barium titanate based dielectric material can be lowered, particularly to 1000° C. or lower. In addition to this, the low dielectric constant ceramics of BaO—TiO$_2$—ZnO system having the above specific composition is co-sintered with the above barium titanate based dielectric material sinterable at a low temperature. It was thereby proved that the joining strength can be improved, the delamination and cracks along the joining interface can be prevented and the diffusion of the components along the joining interface can be prevented. The present invention is thus made.

DETAILED DESCRIPTION OF THE INVENTION

Figure 1:
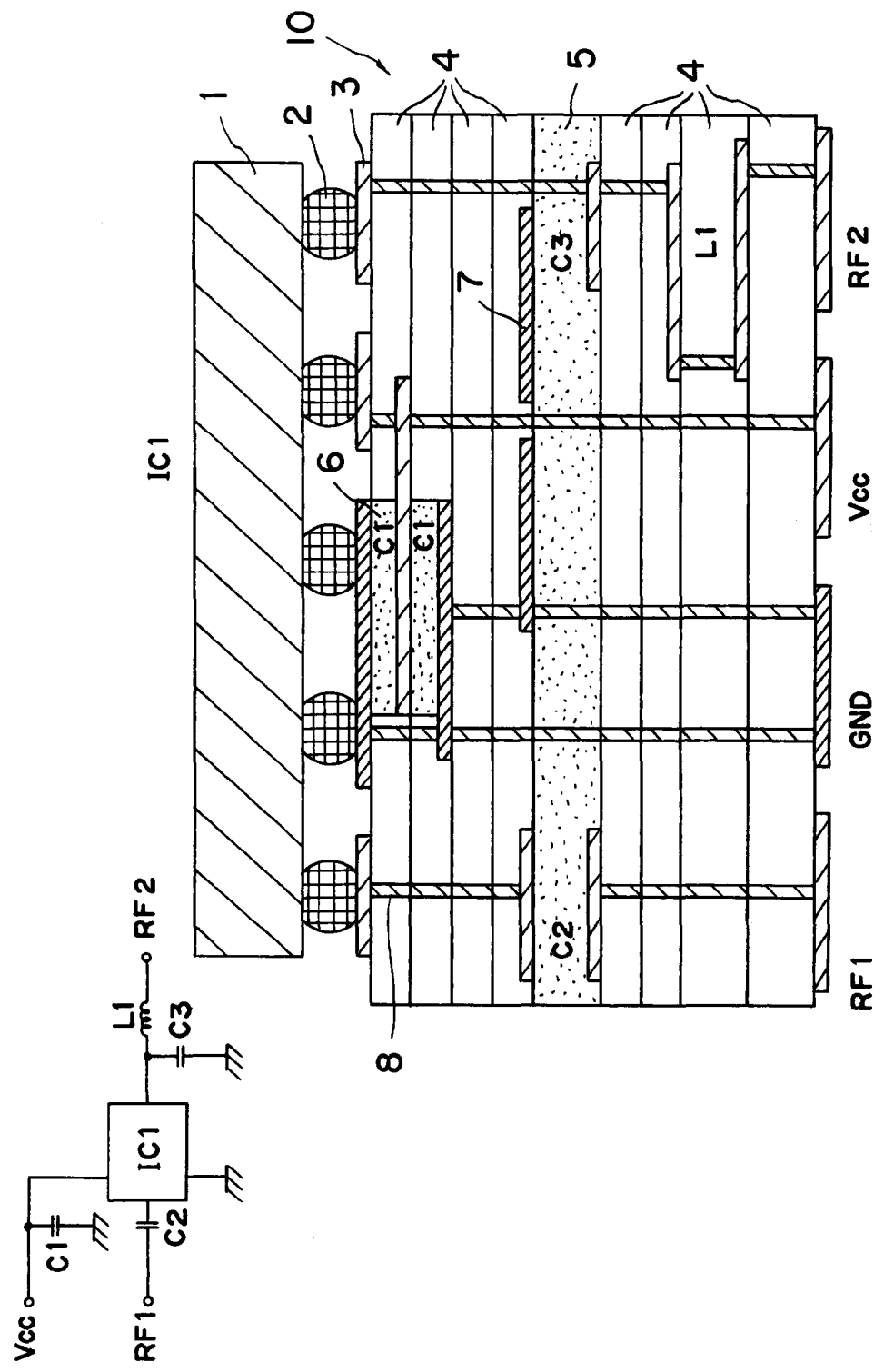
FIG. 1 is a cross sectional view schematically showing an example of a ceramic multilayer substrate according to the present invention.

The dielectric constant of the barium titanate-based dielectric material of the present invention is not particularly limited. However, in a purpose needing a high dielectric constant such as a dielectric capacitor, it is preferred to set the dielectric constant to, for example, 1000 or more.

The barium titanate-based dielectric material referred to herein means a dielectric material mainly composed of barium titanate. Specifically, it can be, in the raw material stage, a calcined body of barium titanate or a mixture of titanium oxide and barium oxide which produce barium titanate after the sintering. When the whole barium titanate-based dielectric material is 100 mol %, 100 mol % may be entirely composed of barium titanate. Otherwise, 30 mol % or less of the barium site of the dielectric material may be substituted with strontium, calcium or magnesium. Further, 30 mol % or less of the titanium site of the dielectric material may be substituted with zirconium.

According to the present invention, $Bi_2O_3$ and CuO are added to the barium titanate based dielectric material. It is thus possible to lower the sintering temperature of the barium titanate based dielectric material.

The method of the addition may be as follows, for example.

(1) $Bi_2O_3$ and CuO are added in the form of different oxides (2) A composite oxide of $Bi_2O_3$ and CuO is added.

(3) Both oxides in (1) and the composite oxide in (2) are added.

The composite oxides in (2) and (3) can be produced by calcination. As the composite oxide, $CuBi_2O_4$ may be given as an example.

On the viewpoint of the present invention, 0.5 weight parts or more and 4.0 weight parts or less of CuO and 4.0 weight parts or more and 9.0 weight parts or less of $Bi_2O_3$ may preferably be added to 100 weight parts of the barium titanate based dielectric material.

By adding 0.5 weight parts or more of CuO and 4.0 weight parts or more of $Bi_2O_3$ to 100 weight parts of the barium titanate based dielectric material, it is possible to improve the density and dielectric constant of the porcelain at the sintering temperature of 1000° C. or lower and to improve the joining property. On the viewpoint, the added amount of CuO may more preferably be 0.85 weight parts or more, and the added amount of $Bi_2O_3$ may more preferably be 5.0 weight parts or more.

Further, by adding 5.0 weight parts or less of CuO and 9.0 weight parts or less of $Bi_2O_3$ to 100 weight parts of the barium titanate based dielectric material, it is possible to improve the density and dielectric constant of the porcelain at the sintering temperature of 1000° C. or lower and to improve the joining property. On the viewpoint, the added amount of CuO may more preferably be 3.0 weight parts or less, and the added amount of $Bi_2O_3$ may more preferably be 8.0 weight parts or less.

The ceramic multilayer substrate of the present invention may preferably be co-sintered at a temperature of 900 to 1000° C. Sintering is difficult at a temperature below 900° C. By setting the sintering temperature to 1000° C. or lower, extensive development of the purposes as described above can be attained with a great industrial advantage. The sintering temperature is further preferably 980° C. or lower. When Ag is used as the conductor, it is preferred to set the sintering temperature to 950° C. or lower.

It is preferred that the barium titanate based dielectric material of the present invention substantially contains no oxide of Pb, except traces of unavoidable impurities.

The barium titanate based dielectric material does not substantially contain a glass component.

As the raw material of each metal component, for example, oxide, nitrate, carbonate and sulfate of each metal can be used.

The layer of a low dielectric constant of the present invention is made of a low dielectric constant ceramic component and a glass component containing boron oxide added to the low dielectric constant ceramic component. The layer of a low dielectric constant mentioned herein refers to a layer having a specific dielectric constant of 30 or lower.

The low dielectric ceramic component is a porcelain having a composition of $xBaO$-$yTiO_2$-$zZnO$. "x", "y" and "z" represent molar ratios, respectively, and satisfy the relationships: $x+y+z=1$; $0.09 \leq x \leq 0.20$; $0.49 \leq y \leq 0.61$; $0.19 \leq z \leq 0.42$. Within the composition range, the joining property with the high dielectric constant ceramic layer can be improved and the specific dielectric constant can be lowered, so that a dense porcelain can be obtained at a low temperature.

On the viewpoint of the present invention, the ratio "x" of BaO in the low dielectric constant ceramic component may more preferably be 0.11 or more, and more preferably be 0.15 or less. Further, the ratio "y" of $TiO_2$ in the low dielectric constant ceramic component may more preferably be 0.5 or more, and more preferably be 0.6 or less. Further, the ratio "z" of ZnO in the low dielectric constant ceramic component may more preferably be 0.3 or more and more preferably be 0.4 or less.

1.0 weight parts or more and 5.0 weight parts or less of the glass component containing boron oxide is added to 100 weight parts of the low dielectric constant ceramic component, so that the sintering temperature of the layer of a low dielectric constant can be effectively lowered.

The glass component containing boron oxide mentioned herein means a glass component containing at least boron oxide. Although the glass component may be composed of boron oxide only, the glass component may preferably contain a metal oxide other than boron oxide. The metal oxide component other than boron oxide includes BaO, $Al_2O_3$, ZnO, $SiO_2$ and a alkaline metal oxide.

According to a preferred embodiment, the ceramic multilayer substrate includes BaO—$Al_2O_3$—$SiO_2$ ceramics, and the low dielectric constant ceramic layer is joined with the BaO—$Al_2O_3$—$SiO_2$ ceramics by co-firing.

The BaO—$Al_2O_3$—$SiO_2$ ceramics can be co-sintered with a wiring conductor made of Ag, Cu, Ag—Pd or the like having a low specific resistance in the ceramic multilayer substrate, resulting in the production of the ceramic multilayer substrate excellent in the high frequency property. Further, since the composition of BaO—$Al_2O_3$—$SiO_2$ ceramics is similar to that of the glass component of the low dielectric constant layer, the joining strength is high and the deviation of properties of the substrate due to the co-sintering is reduced.

The BaO—$Al_2O_3$—$SiO_2$ ceramics may preferably have the following composition.

(Essential Components)
BaO: 40 to 65 weight parts
$Al_2O_3$: 0.1 to 20 weight parts
$SiO_2$: 25 to 46 weight parts (Optional Components)
ZnO: 0.5 to 20 Weight Parts Optionally, any of the glass components containing boron oxide described above may be added thereto in an amount of 0.3 to 5.0 weight parts.

According to the present invention, the ratio of each metal oxide component is an equivalent for each metal oxide in the raw material mixture. The equivalent for each metal oxide in the raw material mixture is determined by the mixing ratio of each metal raw material in the mixture. In the present invention, the mixing ratio of each metal raw material is weighed by a precision scale, and the equivalent is calculated based on the weighed value.

The ceramic multilayer substrate of the present invention may preferably have a conductive film made of a material selected from the group consisting of Ag, Cu and Ag—Pd alloy.

Further, the ceramic multilayer substrate of the present invention has a pair of electrode layers, and the high dielectric constant layer is positioned between the pair of the electrode layers, so that the pair of the electrode layers provides a predetermined amount of electrostatic capacity.

When the ceramic multilayer substrate of the present invention is produced, preferably, each metal component raw material is weighed and wet-mixed at a predetermined ratio, for both of the barium titanate based dielectric constant material and the low dielectric material. Thereafter, the resulting mixed powder for the low dielectric constant material is calcined at 900 to 1300° C. (preferably 1050° C. or higher), and the resulting mixed powder for the high dielectric constant material is calcined at 900 to 1200° C. (preferably 1000 to 1100° C.). Both calcined bodies are pulverized to give ceramic powders, respectively. Each ceramic powder is mixed with an organic binder, a softening agent, a dispersant and an organic solvent, and then molded into sheets by doctor blade method. The resulting molded sheets are laminated to obtain a laminated body. The laminated body is fired at 900 to 1000° C. to thereby obtain the ceramic multilayer substrate.

FIG. 1 shows an example of a ceramic multilayer substrate to which the present invention is applied. The FIGURE is a cross sectional view schematically showing an LC-containing multilayer wiring board. An integrated circuit 1 is mounted on a multilayer wiring board 10 through an external electrode 3 and a solder bump 2. The multilayer wiring board 10 is composed of, for example, the layer 4 of a low dielectric constant and the layers 5, 6 of a high dielectric constant as described above. According to an appropriate design, inner layer electrodes 7 and via conductors 8 are vertically and horizontally formed to constitute multilayer wiring. In the multilayer substrate 10, each of C1, C2 and C3 forms a capacitor and L1 forms an inductor, which can be used for each predetermined purpose. Further, among the layer 4 of a low dielectric constant, for example, the layer forming L1 may be made of $BaO$—$Al_2O_3$—$SiO_2$ ceramics.

EXAMPLES

Experiment A (Production of Raw Materials)

Oxide Powders were Weighted in Accordance with Predetermined compositions and wet-mixed to obtain mixed powders for the barium titanate based dielectric material and the low dielectric constant material, respectively. The resulting mixed powder for the low dielectric constant material was calcined at 1050 to 1300° C. and the mixed powder for the high dielectric constant material was calcined at 1000 to 1100° C. Both calcined bodies were then ground to obtain the respective ceramic powdery raw materials.

(Production of Glass)

Glass species "A", "B" and "C" shown in table 1 were produced. Oxides forming the glass components were weighed and wet-mixed to obtain the respective mixtures. Thereafter, each mixture was melted in a platinum crucible to obtain molten mixture, which was then rapidly cooled in water to obtain a bulk of a glass. The glass was wet-ground to obtain each glass powder of low melting point.

TABLE 1

| Glass Specie | Glass composition (wt %) | | | | |
|---|---|---|---|---|---|
| | B2O3 | SiO2 | Al2O3 | BaO | ZnO |
| A | 22.4 | 14.9 | 4.5 | 58.2 | |
| B | 33.6 | 31.5 | 10.8 | 24.1 | |
| C | 28.0 | 8.0 | | | 64.0 |

(Production of Low Dielectric Constant Material)

The glass and optionally a predetermined amount of CuO were added to the thus obtained calcined raw material, which was then ground to obtain powdery raw material for the low dielectric constant ceramics. The dielectric constants and Q values (at 3 GHz) of the low dielectric constant materials listed in tables 2 to 5 are 20 to 30 and more than 3000, respectively.

(Production of High Dielectric Constant Material)

Predetermined amounts of CuO and $Bi_2O_3$ were added to the calcined body of the barium titanate based dielectric material and ground to obtain each raw material for each high dielectric constant material shown in tables 2 to 5.

(Tape Casting)

An organic binder, a softening agent, a dispersant and an organic solvent were added to the thus prepared powdery raw materials and mixed in a ball mill to obtain a slurry. The slurry was used to mold green sheets each having a thickness of 0.02 to 0.1 mm with a doctor blade system.

(Joining Property, Bending Strength Test)

The low dielectric constant ceramic green sheets were laminated so that the thickness after the sintering was made about 2 mm, and the high dielectric constant ceramic green sheets were inserted between them. The laminated sheets were sintered to obtain a sintered body, from which a test piece of about 3 mm×30 mm×2 mm was cut out and subjected to three-points bending strength test. The joining property was judged by mirror polishing the similar structure and observing cracks, spaces and mutual diffusion along the joining interface with an electron microscope. The results were shown in tables 2, 3, 4 and 5.

(Measurement of Dielectric Constant)

The high dielectric constant ceramic green sheet was inserted between the low dielectric constant ceramic green sheets to obtain a structure. An electrode pattern was formed on the structure by screen printing so that a part of the high dielectric constant layer was made a capacitor layer in advance (An area of overlapping of the electrodes was 2 mm$^2$ after the sintering). The electrode was drawn by an via electrode. Thereafter, the sintered body was cut to an appropriate dimension to measure the capacitance and to calculate the dielectric constant. The results were shown in tables 2, 3, 4 and 5.

TABLE 2

| | Low dielectric constant ceramic component | | | | | High dielectric constant ceramic component | | | | | |
|---|---|---|---|---|---|---|---|---|---|---|---|
| | $x$BaO—$y$TiO2—$z$ZnO (mol %) | | | Glass amount Weight | Glass | Main component (weight parts) | Sub component (weight parts) | | Sintering Temperature | Bending Strength | Joining |
| Sample No. | x | y | z | Parts | specie | BaTiO3 | CuO | Bi2O3 | ° C. | Mpa | Property |
| 1 | 0.08 | 0.54 | 0.38 | 3.0 | A | 100 | 0.87 | 5.13 | 0 | 193 | Δ |
| 2 | 0.09 | 0.49 | 0.42 | 3.0 | A | 100 | 0.87 | 5.13 | 920 | 210 | ○ |
| 3 | 0.09 | 0.61 | 0.30 | 3.0 | A | 100 | 0.87 | 5.13 | 920 | 218 | ○ |
| 4 | 0.11 | 0.54 | 0.35 | 0.5 | A | 100 | 0.87 | 5.13 | 1000 | 140 | X |
| 5 | 0.11 | 0.54 | 0.35 | 1.0 | A | 100 | 0.87 | 5.13 | 1000 | 201 | ○ |
| 6 | 0.11 | 0.54 | 0.35 | 2.5 | A | 100 | 0.87 | 5.13 | 940 | 228 | ○ |

TABLE 2-continued

| Sample No. | Low dielectric constant ceramic component | | | | | High dielectric constant ceramic component | | | Sintering Temperature ° C. | Bending Strength Mpa | Joining Property |
|---|---|---|---|---|---|---|---|---|---|---|---|
| | $x$BaO—$y$TiO2—$z$ZnO (mol %) | | | Glass amount Weight Parts | Glass specie | Main component (weight parts) | Sub component (weight parts) | | | | |
| | x | y | z | | | BaTiO3 | CuO | Bi2O3 | | | |
| 7 | 0.11 | 0.54 | 0.35 | 3.0 | A | 100 | 0.87 | 5.13 | 920 | 240 | ○ |
| 8 | 0.11 | 0.54 | 0.35 | 5.0 | A | 100 | 0.87 | 5.13 | 920 | 231 | ○ |
| 9 | 0.11 | 0.54 | 0.35 | 6.0 | A | 100 | 0.87 | 5.13 | 920 | 191 | Δ |

As to the item of "Joining property", "○" indicates the case that the diffusion, micro crack and delamination were not observed and the bending strength was higher than 200 MPa. "Δ" indicates the case that the diffusion or micro crack was observed. "X" indicates the case that much diffusion components were observed or delamination or cracks were observed.

As shown in table 2, in the sample 1, the ratio "x" of BaO was out of the present invention and the diffusion and micro cracks were observed. In the samples 2 and 3, excellent joining property was obtained. In the sample 4, the added amount of the glass into the layer of a low dielectric constant was 0.5 weight parts, which is out of the present invention, and the joining property with the layer of a high dielectric constant was poor. In the samples 5, 6, 7 and 8, excellent joining property was obtained. In the sample 9, the added amount of the glass into the layer of a low dielectric constant was 6.0 weight parts, which is out of the present invention, and the diffusion and micro cracks were observed.

TABLE 3

| Sample No. | Low dielectric constant ceramic component | | | | | High dielectric constant Ceramic component | | | Sintering temperature ° C. | Bending strength Mpa | Joining Property |
|---|---|---|---|---|---|---|---|---|---|---|---|
| | $x$BaO—$y$TiO2—$z$ZnO (Mol %) | | | Glass Amount Weight parts | Glass specie | Main component (weight Parts) | Sub component (weight parts) | | | | |
| | x | y | z | | | BaTiO3 | CuO | Bi2O3 | | | |
| 10 | 0.20 | 0.49 | 0.31 | 3.0 | A | 100 | 0.87 | 5.13 | 920 | 202 | ○ |
| 11 | 0.20 | 0.61 | 0.19 | 3.0 | A | 100 | 0.87 | 5.13 | 920 | 212 | ○ |
| 12 | 0.22 | 0.56 | 0.22 | 3.0 | A | 100 | 0.87 | 5.13 | 940 | 155 | X |
| 13 | 0.25 | 0.50 | 0.25 | 3.0 | A | 100 | 0.87 | 5.13 | 980 | 143 | X |
| 14 | 0.11 | 0.63 | 0.26 | 3.0 | A | 100 | 0.87 | 5.13 | 920 | 179 | Δ |
| 15 | 0.11 | 0.47 | 0.42 | 3.0 | A | 100 | 0.87 | 5.13 | 920 | 188 | Δ |
| 16 | 0.20 | 0.64 | 0.16 | 3.0 | A | 100 | 0.87 | 5.13 | 960 | 142 | X |
| 17 | 0.09 | 0.47 | 0.44 | 3.0 | A | 100 | 0.87 | 5.13 | 920 | 177 | Δ |
| 18 | 0.11 | 0.54 | 0.35 | 3.0 | B | 100 | 0.87 | 5.13 | 920 | 225 | ○ |
| 19 | 0.11 | 0.54 | 0.35 | 3.0 | C | 100 | 0.87 | 5.13 | 920 | 217 | ○ |

As shown in table 3, in the samples 10 and 11, excellent joining property was obtained. In the samples 12 and 13, the ratios "x" of BaO were 0.22 and 0.25, which were out of the present invention, and the joining property was deteriorated. In the samples 14 and 15, the ratio "y" of $TiO_2$ was out of the present invention and the joining property was deteriorated. In the samples 16 and 17, the ratio "y" of $TiO_2$ and the ratio "z" of ZnO were out of the present invention, and the joining property was deteriorated. In the samples 18 and 19, excellent property was obtained.

TABLE 4

| Sample No. | Low dielectric constant Ceramic component | | | | | | High dielectric constant Ceramic component | | | Sintering Temperature ° C. | Bending Strength MPa | Dielectric Constant High dielectric constant layer ∈ |
|---|---|---|---|---|---|---|---|---|---|---|---|---|
| | xBaO—yTiO2—zZnO (mol %) | | | Glass Amount Weight Parts | Glass Specie | CuO Amount Weight Parts | Main component (weight Parts) | Sub component (weight parts) | | | | |
| | x | y | z | | | | BaTiO3 | CuO | Bi2O3 | | | |
| 20 (7) | 0.11 | 0.54 | 0.35 | 3.0 | A | 0 | 100 | 0.87 | 5.13 | 920 | 240 | 474 |
| 21 | 0.11 | 0.54 | 0.35 | 3.0 | A | 2 | 100 | 0.87 | 5.13 | 920 | 242 | 810 |
| 22 | 0.11 | 0.54 | 0.35 | 3.0 | A | 4 | 100 | 0.87 | 5.13 | 920 | 221 | 1082 |
| 23 | 0.11 | 0.54 | 0.35 | 3.0 | A | 8 | 100 | 0.87 | 5.13 | 920 | 232 | 1289 |
| 24 | 0.11 | 0.54 | 0.35 | 3.0 | A | 12 | 100 | 0.87 | 5.13 | 920 | 223 | 1244 |
| 25 | 0.11 | 0.54 | 0.35 | 3.0 | A | 15 | 100 | 0.87 | 5.13 | 920 | 215 | 1037 |
| 26 | 0.11 | 0.54 | 0.35 | 3.0 | A | 20 | 100 | 0.87 | 5.13 | 920 | 201 | 922 |

As shown in table 4, CuO was added to the layer of a low dielectric constant so as to provide the advantageous effects of further improving the dielectric constant of the co-sintered layer of a high dielectric constant. The ratio may preferably be 20 weight parts or lower, and more preferably be 2 to 20 weight parts, with respect to 100 weight parts of the low dielectric constant ceramic component.

TABLE 5

| Sample No. | Low dielectric constant Ceramic component | | | | | | High dielectric constant Ceramic component | | | Sintering Temperature ° C. | Bending Strength MPa | Dielectric Constant High Dielectric Constant Layer ∈ |
|---|---|---|---|---|---|---|---|---|---|---|---|---|
| | xBaO—yTiO2—zZnO (mole %) | | | Glass Amount Weight Parts | Glass Specie | CuO Amount Weight Parts | Main component (Weight Parts) | Sub Component (Weight Parts) | | | | |
| | x | y | z | | | | BaTiO3 | CuO | Bi2O3 | | | |
| 27 | 0.11 | 0.54 | 0.35 | 3.0 | A | 8 | 100 | 0.50 | 5.13 | 920 | 208 | 1012 |
| 28 | 0.11 | 0.54 | 0.35 | 3.0 | A | 8 | 100 | 0.73 | 4.27 | 920 | 211 | 1088 |
| 29 | 0.11 | 0.54 | 0.35 | 3.0 | A | 8 | 100 | 0.85 | 5.00 | 920 | 228 | 1125 |
| 30 | 0.11 | 0.54 | 0.35 | 3.0 | A | 8 | 100 | 0.87 | 5.13 | 920 | 232 | 1289 |
| 31 | 0.11 | 0.54 | 0.35 | 3.0 | A | 8 | 100 | 1.02 | 5.97 | 920 | 230 | 1222 |
| 32 | 0.11 | 0.54 | 0.35 | 3.0 | A | 8 | 100 | 1.16 | 6.83 | 920 | 226 | 1164 |
| 33 | 0.11 | 0.54 | 0.35 | 3.0 | A | 8 | 100 | 1.31 | 7.69 | 920 | 225 | 1135 |
| 34 | 0.11 | 0.54 | 0.35 | 3.0 | A | 8 | 100 | 1.50 | 9.00 | 920 | 214 | 1031 |
| 35 | 0.11 | 0.54 | 0.35 | 3.0 | A | 8 | 100 | 1.73 | 5.13 | 920 | 232 | 1305 |
| 36 | 0.11 | 0.54 | 0.35 | 3.0 | A | 8 | 100 | 3.00 | 5.13 | 920 | 245 | 1385 |
| 37 | 0.11 | 0.54 | 0.35 | 3.0 | A | 8 | 100 | 4.00 | 5.13 | 920 | 205 | 1201 |

As shown in table 5, in the samples 27 to 37, excellent bending strength and dielectric constant were obtained.

While specific preferred embodiments have been shown and described, the present invention is never limited by these specific embodiments, and can be carried out with various modifications and substitutions without departing from the scope of the claims thereof.

The invention claimed is:

1. A ceramic multilayer substrate obtained by co-sintering low dielectric constant and high dielectric constant layers, the ceramic multilayer substrate comprising:
   a plurality of low dielectric constant layers, each comprising a ceramic component having a composition of xBaO-yTiO$_2$-zZnO ("x", "y" and "z" represent molar ratios, respectively, and satisfy the relationships: x+y+z=1; $0.09 \leq x \leq 0.20$; $0.49 \leq y \leq 0.61$; $0.19 \leq z \leq 0.42$) and 1.0 to 5.0 weight parts of a glass component comprising boron oxide with respect to 100 weight parts of the ceramic component;
   a high dielectric constant layer comprising a barium titanate based dielectric material with CuO and Bi$_2$O$_3$ added thereto;
   a layer of a BaO—Al$_2$O$_3$—SiO$_2$ series ceramic; and
   a pair of electrode layers;
   wherein the layer of the BaO—Al$_2$O$_3$—SiO$_2$ series ceramic is provided between and joined with the low dielectric constant layers and does not contact the high dielectric constant layer;
   wherein the pair of electrode layers are provided on main faces of the high dielectric constant layer, respectively, so that the pair of electrode layers provides a predetermined electrostatic capacity; and
   wherein the high dielectric constant layer is joined with the low dielectric constant layers at main faces thereof, respectively.

2. The ceramic multilayer substrate of claim 1, wherein 0.5 weight part or more and 4.0 weight parts or less of CuO and 4.0 weight parts or more and 9.0 weight parts or less of Bi$_2$O$_3$ are added to 100 weight parts of the barium titanate based dielectric material in the high dielectric constant layer.

3. The ceramic multilayer substrate of claim 1, wherein 20 weight parts or less of CuO is added to 100 weight parts of the ceramic component in the low dielectric constant layers.

4. The ceramic multilayer substrate of claim 1, wherein the co-sintering is performed at a temperature of 1000° C. or lower.

5. The ceramic multilayer substrate of claim 1, further comprising a conductive film comprising a material selected from the group consisting of Ag, Cu and Ag—Pd alloy.

* * * * *